(12) United States Patent
Sun

(10) Patent No.: US 6,242,346 B1
(45) Date of Patent: Jun. 5, 2001

(54) METALLIZATION FOR UNCOVERED CONTACTS AND VIAS

(75) Inventor: Shih-Wei Sun, Taipei (TW)

(73) Assignee: United Microelectronics Corporation (TW)

( * ) Notice: Subject to any disclaimer, the term of this patent is extended or adjusted under 35 U.S.C. 154(b) by 0 days.

(21) Appl. No.: 08/948,369

(22) Filed: Oct. 9, 1997

Related U.S. Application Data

(60) Provisional application No. 60/054,741, filed on Aug. 13, 1997.

(51) Int. Cl.$^7$ .................................................. H01L 21/44
(52) U.S. Cl. ........................... 438/669; 438/596; 438/672
(58) Field of Search ..................................... 438/595, 596, 438/629, 669, 672, 673; 257/696, 763

(56) References Cited

U.S. PATENT DOCUMENTS

| | | | |
|---|---|---|---|
| 4,847,674 | * 7/1989 | Sliwa et al. | 257/763 |
| 5,321,211 | * 6/1994 | Haslam et al. | 174/262 |
| 5,756,396 | * 5/1998 | Lee et al. | 438/622 |

FOREIGN PATENT DOCUMENTS

| | | | |
|---|---|---|---|
| 1-5053 | * 1/1989 | (JP) | 257/763 |
| 4-196125 | * 7/1992 | (JP) | 257/763 |

OTHER PUBLICATIONS

"Customized Metallization for Low Capacitance of Low Resistance", IBM Tech. Disc. Bull., vol. 28, No. 6, Nov. 1985, pp. 2719–2720.*

Wolf, S., Silicon Processing for the VLSI Era, vol. 2, 1990, Lattice Press, pp. 240–245.*

\* cited by examiner

*Primary Examiner*—T. N. Quach
(74) *Attorney, Agent, or Firm*—Rabin & Champagne, P.C.

(57) ABSTRACT

An integrated circuit including a dielectric layer over a substrate and a via formed through the dielectric layer exposing a conductive region in the substrate. A first conductive layer is formed over the dielectric layer and within the via. Etching through a portion of the first conductive layer is carried out to form first and second individual conducting regions separated from one another by a first exposed portion of the dielectric layer having a first width. A second conductive layer is formed over the first and second individual conducting regions, over the first exposed portion of the dielectric layer, and filling any unfilled via regions. Etching the second conducting layer is carried out to expose a portion of the dielectric layer for a second time and to V form first and second wiring lines. The first wiring line includes the first conducting region and first remaining portions of the second conductive layer, and the second wiring line including the second conducting region and second remaining portions of the second conductive layer. The presence of the remaining portions of the second conductive layer as part of the wiring lines effectively decreases the size of the gap between the wiring lines and promotes subsequent gap-filling.

10 Claims, 4 Drawing Sheets

METALLIZATION FOR UNCOVERED CONTACTS AND VIAS

This application claims priority from provisional application Ser. No. 60/054,741, filed Aug. 13, 1997.

BACKGROUND OF THE INVENTION

1. Field of the Invention

The present invention relates to the formation of wiring structures in integrated circuit devices. More particularly, the present invention relates to methods for improving process margins for forming wiring lines and for decreasing the spacing between wiring lines.

2. Description of the Related Art

Many highly integrated semiconductor circuits utilize multilevel wiring line structures for interconnecting regions within devices and for interconnecting one or more devices within the integrated circuits. Most often, the wiring lines of the multilevel interconnect structure are formed by conventional photolithographic techniques. For example, devices such as FETs, diodes or transistors are formed in and on the substrate to form an integrated circuit device and then a first level of insulating material is deposited over the device. A pattern of contact holes or vias is defined through the first level of insulating material and, at some point in the process, the contact holes are filled with a conducting material to define vertical interconnects through the first level of insulating material to contact appropriate portions of the devices on the surface of the substrate. A first metal layer that will be patterned to form a first level of wiring lines is deposited over the first level of insulating material and over the surface of the device. An etch mask is formed on the surface of the first metal layer that defines a pattern of openings above the wiring lines that will connect to various ones of the vertical interconnects. Generally, the etch mask is formed by providing a layer of photoresist on the surface of the first metal layer, exposing the layer of photoresist through an exposure mask and developing the photoresist to form the etch mask. Etching processes remove those portions of the first metal layer exposed by the etch mask, leaving behind the desired pattern of wiring lines. The etch mask is removed by washing. Processing continues to form additional levels of interconnects and wiring lines to complete the circuit.

A conventional multilevel wiring line structure and a method of making the structure are illustrated in FIGS. 1–3. FIG. 1 illustrates a semiconductor circuit at an intermediate step in the manufacturing process with a layer of dielectric material 12 covering a semiconductor substrate 10 where various devices have previously been formed. FIG. 2 illustrates a contact opening or via 14 formed above an underlying metal or polysilicon conductor or above a conductive region in the substrate 10. The first level wiring layer 16 includes material 15 located within the via 14 to contact the underlying conductor or conductive region. The wiring layer 16 is patterned and anisotropically etched to define individual wiring lines 18 on the surface of the dielectric layer. Often, the pattern is formed so that the anisotropic etching takes place near the edges of contact vias. Ideally, the individual wiring lines 18 will appear as illustrated in FIG. 3, with the via 14 centered under the wiring line and filled with wiring line material 15.

Dielectric layers for wiring line isolation are often formed by chemical vapor deposition (CVD) processes, which deposit a material onto a surface by transporting gaseous precursors to the surface and causing the precursors to react at the surface. A common CVD process for gap filling is plasma-enhanced chemical vapor deposition (PECVD), which uses a plasma to impart energy to the reactant gases. It has been observed that dielectric material builds up on the upper corner portions of wiring lines when deposition methods such as PECVD are used to fill small gaps between the wiring lines. The build-up of oxide can cause undesirable cavities or voids to form within the dielectric material between the wiring lines. As illustrated in FIG. 4, an oxide layer 20 deposited using PECVD TEOS over substrate 22, over the wiring lines 24 and within the gaps 26 between wiring lines 24, will build up on the upper corner regions of the wiring lines 24 and form overhang regions 28. As the deposition proceeds and the oxide material accumulates on the overhang regions 28, adjacent overhang regions 28 will contact each other and close off voids 30 between the wiring lines 24, as illustrated in FIG. 5. These voids 30 may create channels that run parallel to adjacent metal lines 24 along their length. Subsequent planarization processes may uncover or partially open the voids 30 and materials such as polishing chemicals or polymerized etch byproducts may become trapped in the voids 30. Material trapped in the voids 30 may be difficult to remove, and subsequent processing steps may then exhibit reduced yields due to contamination from the materials trapped in the voids 30. As a result, it is desirable to completely fill gaps between wiring lines to prevent the formation of voids where contaminants may accumulate.

In addition, as devices are made smaller and smaller, it is desirable for the wiring lines to be spaced very closely together in order to increase the wiring line density in the device. A limiting factor in such applications is the resolution limit of the lithography method used for patterning the wiring lines. It would be desirable to form wiring lines which are spaced apart a distance less than the lithography resolution limit.

SUMMARY OF THE PREFERRED EMBODIMENTS

Embodiments of the present invention include a method of forming an integrated circuit including providing a first conductive layer on an underlying layer and forming an opening through the first conductive layer and exposing a portion of the underlying layer. A second conductive layer is formed over the first conductive layer and over the exposed portion of the underlying layer. The second conductive layer is etched back so that part of the previously exposed portion of the underlying layer is exposed a second time and portions of the second conductive layer remain within the opening.

Other embodiments of the present invention form an integrated circuit by providing a dielectric layer over a substrate and forming a via through at least a portion of the dielectric layer. A first conductive layer is formed over the dielectric layer and within the via. Etching through a portion of the first conductive layer exposes a portion of the dielectric layer and forms first and second individual conductors separated from one another by a first distance. A second conductive layer is formed over the first and second individual conductors and over the exposed portion of the dielectric layer. Etching back the second conductive layer exposes a portion of the dielectric layer for a second time and forms first and second wiring lines, the first wiring line including the first individual conductor and first sidewall structures formed from the second conductive layer, the second wiring line including the second individual conductor and sidewall structures formed from the second conductive layer.

Additional embodiments of the present invention form an integrated circuit by providing a first conducting layer over a substrate and depositing a photoresist layer over the first conducting layer. Patterning, exposing and developing of the photoresist layer are carried out using a lithographic technique having a lithography resolution limit so that portions of the first conducting layer are uncovered by photoresist. Uncovered portions of the conducting layer are etched through to form first wiring lines and first gaps separating the first wiring lines. A second conducting layer is formed over the first wiring lines and within the first gaps between the first wiring lines. Etching back the second conducting layer is carried out to form second wiring lines including the first wiring lines and portions of the second conducting layer, the second wiring lines separated by second gaps having a width smaller than the lithography resolution limit.

BRIEF DESCRIPTION OF THE DRAWINGS

Embodiments of the present invention are described with reference to the accompanying drawings which, for illustrative purposes, are schematic and are not drawn to scale, where.

DETAILED DESCRIPTION OF THE PREFERRED EMBODIMENTS

Figure 1:
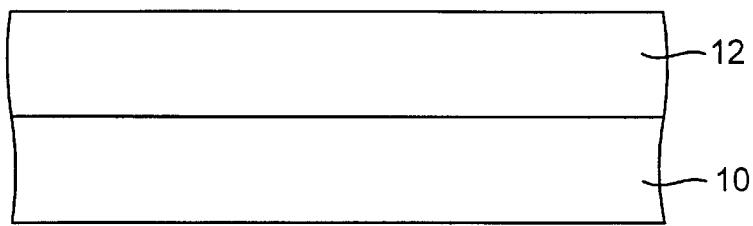
FIGS. 1–3 illustrate steps in the formation of an ideal interconnect structure using conventional techniques.
Figure 2:
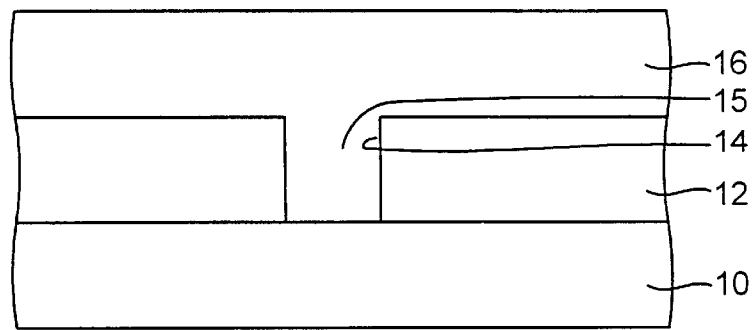
Figure 3:
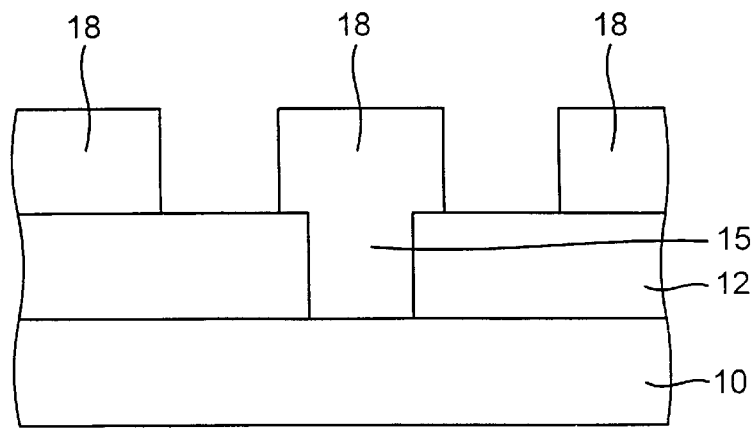
Figure 4:
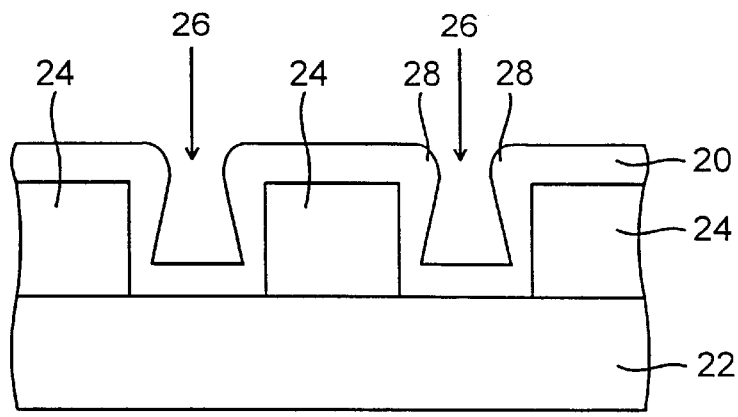
FIGS. 4–5 illustrate the formation of voids between wiring lines during deposition of a dielectric material in an interconnect structure using conventional methods.
Figure 5:
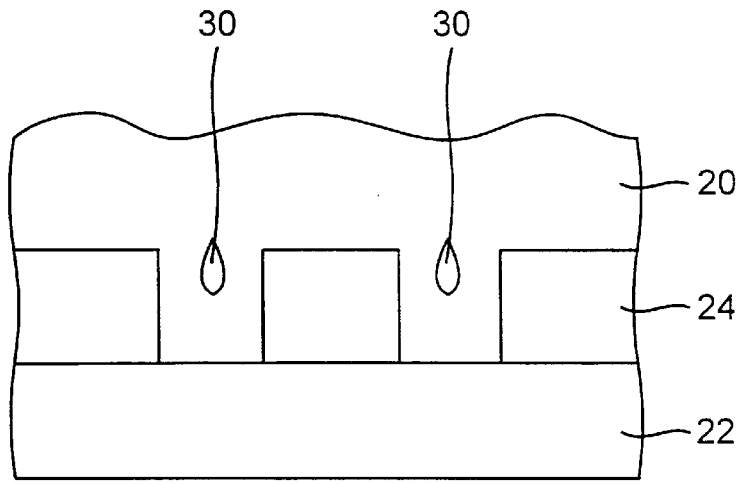

During the formation of multilayer devices, connections between wiring lines or connections between wiring lines and active devices in a substrate may be made through vias extending between a lower layer and an upper conducting layer. The upper conducting layer is typically formed into wiring lines by forming a photoresist mask with a pattern corresponding to each individual wiring line and then etching through portions of the conducting layer to form the individual wiring lines. Often, the pattern includes wiring lines aligned over, or nearly aligned over, vias or interconnects so that etching to transfer the mask pattern to the wiring lines includes etching near the edges of the vias. Due to alignment and manufacturing errors, a portion of the metal conductor within the contact via may be etched, removing part of the vertical interconnect and leaving the via partially unfilled. The resulting partially unfilled via may also be called an uncovered via or an uncovered contact because the removal of material uncovers a portion of the via or contact. The partial etching of the conductor or interconnect may lead to a variety of problems in the interconnect structure. The cross-sectional area of the conductor within the via decreases and the etching process can introduce a sharp corner into the conductor within the via. The decreased cross-sectional area and the sharp corner can both contribute to an increase in electromigration, in which metal is redistributed within the conductor and voids are formed. Electromigration can lead to early failure of the interconnection. The unfilled via region may also become filled with contaminants such as polymers formed as a byproduct of the reactions between the etchant gases and the photoresist or the material being etched. Trapped contaminants can lead to poor device performance and reduced product yields.

Another problem with multilevel wiring line structures relates to the formation of dielectric layers for wiring line and interlayer isolation. Such dielectric layers fill the gaps between wiring lines. As devices are scaled to smaller geometries, the gaps formed between wiring lines generally have high aspect ratios (ratio of height to width) which are harder to fill with dielectric material than small aspect ratio gaps. An oxide material deposited over a wiring line pattern using plasma enhanced chemical vapor deposition (PECVD) from a TEOS source gas will build up on the upper corner regions of wiring lines. As the deposition proceeds, voids may form as oxide layers on adjacent upper corner regions of adjacent wiring lines contact one another and close off the top of the gap prior to the rest of the gap being filled. Subsequent processing steps such as planarization may open the voids and facilitate the introduction of contaminants into the voids, leading to reduced product yields. Therefore, for adequate device performance in reduced dimension devices it is necessary that the lithographic patterning and etching steps be accurately carried out to ensure proper location and sizing of the wiring lines and gaps. It is also preferred that the dielectric material subsequently deposited into the gaps between wiring lines completely fill the gaps to prevent void formation.

Certain embodiments of the present invention address these difficulties by providing methods for filling unfilled via regions and facilitating the gap-fill process to inhibit void formation. This is accomplished by depositing a layer of metal over the wiring lines and into the gaps between the wiring lines. Any unfilled via regions existing after formation of the wiring lines will be filled by the layer of metal. The layer of metal is then etched back so that the metal is removed from the top of the wiring lines and removed from a portion of the gap between wiring lines. A gap between the wiring lines will again be formed, and the remaining metal will exist in any previously unfilled via regions and at the ends of the wiring lines. Preferably the remaining wiring line material has a tapered shape to facilitate subsequent gap filling procedures.

Preferred embodiments of the present invention are now discussed with reference to FIGS. 6–10. These figures illustrate steps in the formation of a particular configuration of an interconnect structure. While these embodiments illustrate particularly preferred embodiments of the invention, aspects of the present invention find application in other configurations of interconnects. In addition, where the following discussion identifies various device and/or wiring line levels, it should be understood that these are labels only and that the present invention may be applied to higher level wiring lines or for forming connections between non-adjacent (e.g., first and third or other) levels of wiring lines.

Figure 6:
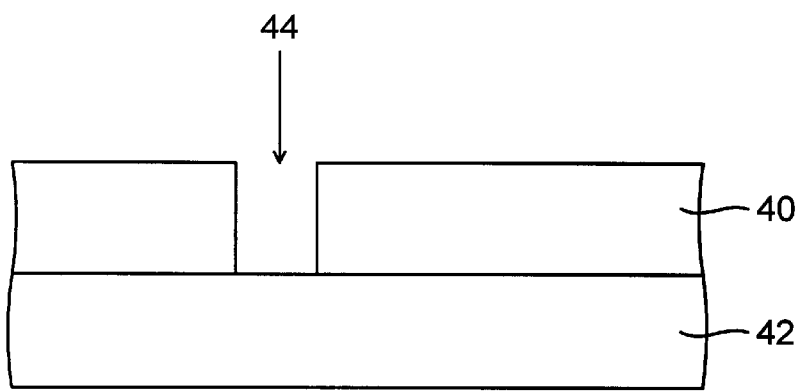
FIGS. 6–10 illustrate steps in the formation of an interconnect structure according to embodiments of the present invention.
Figure 7:
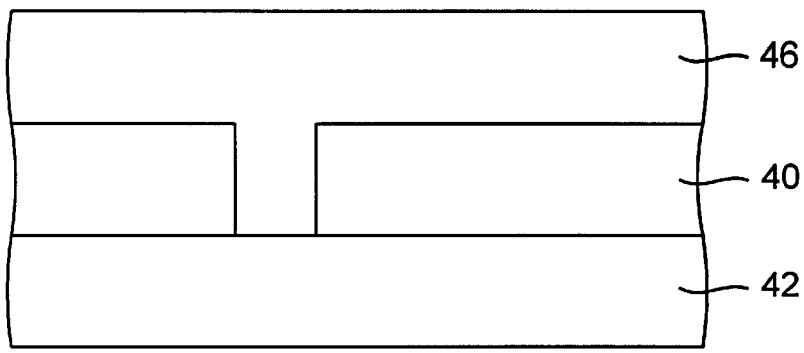
Figure 8:
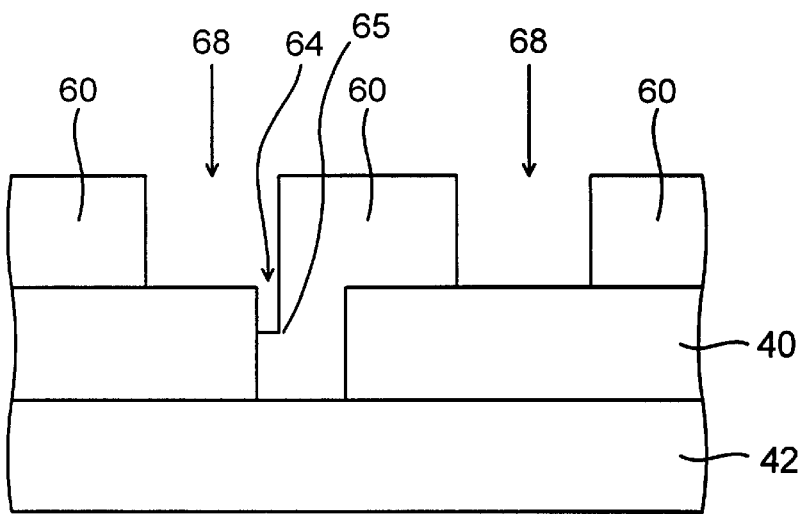

Embodiments of the present invention can be incorporated into a variety of different methods for forming wiring and interconnect structures. FIG. 6 illustrates a semiconductor circuit at an intermediate step in the manufacturing process with a layer of dielectric material 40 covering a semiconductor substrate 42. The dielectric material 40 is preferably a silicon oxide or borophosphosilicate glass (BPSG) layer. Contact opening or via 44 is formed above an underlying metal, polysilicon or active region in the substrate 42. FIG. 7 illustrates a first metal layer 46 deposited within the via 44 and above the dielectric layer 42. A barrier layer such as titanium, titanium nitride or titanium tungsten may be formed between the dielectric layer 40 and the first metal layer 46, lining the via 44, if desired. The first metal layer 46 is preferably a conformal layer of aluminum or tungsten deposited to uniformly fill the vias and to provide a substantially planar surface after the vias are filled. Aluminum may be conformally deposited by either CVD or sputtering onto substrate maintained at a temperature of approximately 400° C. or greater. Conventional photolithography may be used to form a photoresist mask exposing the first metal layer 46 above regions of the metal layer to be removed to provide the pattern of wiring lines. Anisotropic etching is performed to remove portions of the first metal layer 46 and to form individual metal wiring lines 60. For any number of reasons, for example, misalignment of the photoresist mask, the wiring line metal within the via 44 may be partially etched during the process. Difficulties in alignment may occur when forming a photoresist mask over a metal layer such as aluminum because the aluminum layer is opaque. As illustrated in FIG. 8, misalignment may lead to etching a portion of the metal within the via and forming an opening 64 in the conductor within the via 44. The opening 64 in the conductor may lead to a variety of problems in the interconnect structure. In addition to the risk of trapping contaminants, the presence of the opening 64 in the conductor decreases the cross-sectional area of a portion of the conductor within the via. In addition, the opening 64 in the conductor may have a step-like structure including a sharp corner 65 within the via. Both decreased cross-sectional area and the presence of sharp corners increase the occurrence of electromigration and increase the failure rate for interconnections.

Figure 9:
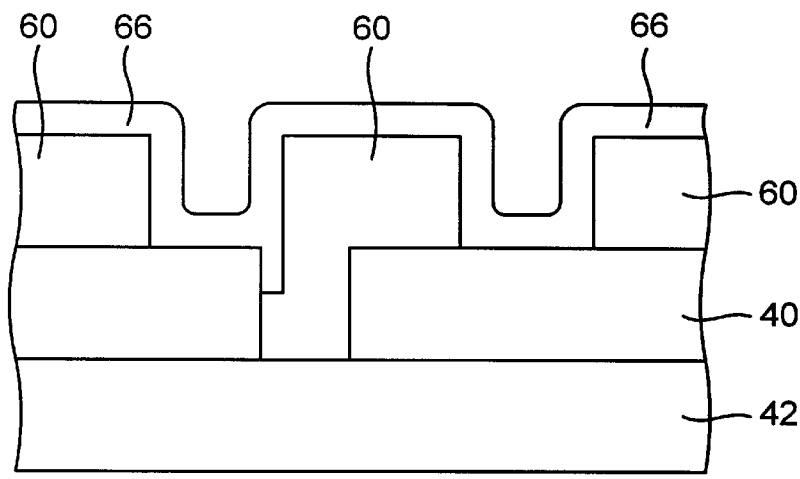
Figure 10:
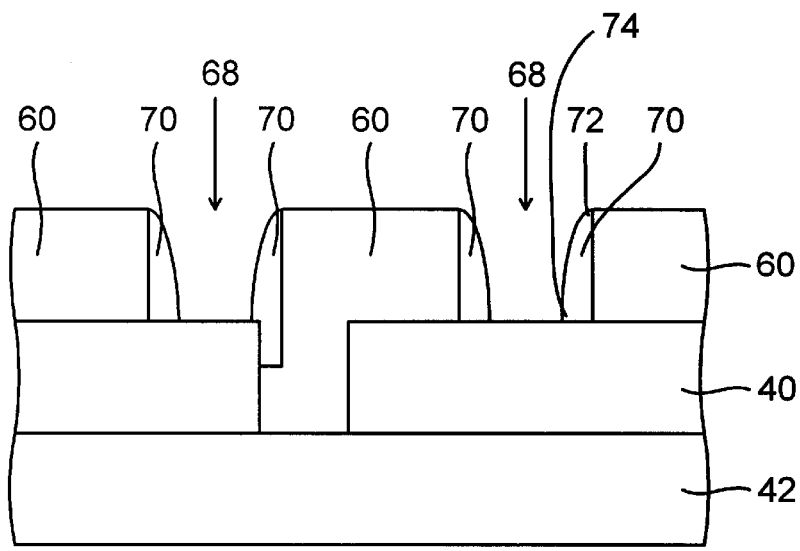

The undesirable opening 64 within the via may then filled by the deposition of a second metal layer 66. The second metal layer 66 is deposited over the rest of the exposed surface of the dielectric layer 40, within the gaps 68 and over the top and sides of the wiring lines 60, as illustrated in FIG. 9. The second metal layer 66 prevents contaminants from collecting within the opening 64 and reduces the electromigration problem. Preferably, the second metal layer 66 is a conformal aluminum or tungsten layer having a smaller thickness than the first metal layer 46. A barrier layer such as titanium, titanium nitride or titanium tungsten may be formed beneath at least a portion of the second metal layer 66, if desired. The thickness of the second metal layer deposited is preferably as thick as practical while preserving good process margins. An etch back process is performed on the second metal layer 66 to separate adjacent wiring lines and to form the second metal layer 66 into the metal sidewall spacer structures shown in FIG. 10. The width of the spacers will generally be approximately the same as the thickness of the second metal layer. Accordingly, the thickness of the second metal layer should preferably be less than one half of the width of the separation between wiring lines. As a practical matter, it is preferred to deposit the wiring line to a thickness significantly less than one half the width of the wiring lines separation. If, for example, the wiring lines are separated by about 0.5 $\mu$m, the second wiring layer might be deposited to a thickness of about 200–1000 Å. As illustrated in FIG. 10, the second metal layer 66 is then etched back, preferably using an anisotropic plasma etchant derived from, for example, a source gas including $Cl_2$ or HCl so that the second metal layer 66 is removed from the top surface of the wiring lines 60 and is removed from portions of the dielectric layer 40 in the gaps 68 between the individual wiring lines 60, exposing those portions of the dielectric layer 40. The previously existing opening 64 remains filled with the second metal layer. In addition, remaining portions of the second metal layer 66 extend along in contact with the sides of the wiring lines 60, forming second metal sidewall structures 70 that effectively widen the wiring lines 60 from their original width prior to deposition of the second metal layer 66. Of course, widening the wiring lines 60 increases their conductivity, which can reduce a number of problems with the interconnect structure including reducing electromigration. The sidewall structures 70 of the second metal layer preferably have a tapered shape that facilitates gap-filling. Particularly preferred embodiments have an outwardly curving shape from the top 72 to the bottom 74 in which the spacing between the individual wiring lines (including the sidewall structures 70 of the second metal layer) is smaller at the bottom of the wiring line than at the top of the wiring line, as illustrated in FIG. 10. Such a curved shape for the second metal sidewall structures 70 is preferably formed during the etch back step. A tapered or curved shape for the second metal sidewall structures 70 forms a shaped gap 68 between wiring lines that is widest at the top of the gap and which smoothly narrows to the bottom of the gap at the surface of dielectric layer 40. This shaped gap will encourage complete gap-filling between the wiring lines during subsequent process steps.

Embodiments of the present invention need not refill overetched vias to provide the advantages of the steps of depositing and etching back the second metal layer 66 which form the tapered sidewall structures extending along the sides of the wiring lines 60 as illustrated in FIG. 10. In another aspect of the present invention, it is desirable for the wiring lines to be spaced very closely together or to make the wiring lines as wide as possible while maintaining good yields. A limiting factor in forming densely packed structures is often the resolution limit of the lithography method used for patterning the wiring lines. To accommodate the limitations of conventional lithography processes, it is typical to form wiring lines separated by a distance equal to the design rule for that process. In densely packed wiring line structures, it is sometimes necessary to make the wiring lines narrower to allow for the spacing required by the lithography process. Narrower wiring lines have higher resistivity, which can lead to slower signal propagation and higher levels of ohmic heating. Certain embodiments of the present invention space the lines closer together than the lithography resolution limit. This is because, as described above and shown in FIG. 10, the sidewall structures 70 act to increase the width of the wiring lines 60 and thereby decrease the width of the gap 68. This sub-resolution limit spacing is achieved by using conventional lithography followed by the second metal deposition and etch back process, which does not require lithography and so is not resolution limited. If the lithographic pattern used to form the wiring line 60 spacing is sized at the lithography resolution limit, then the remaining metal layer 70 acts to narrow the gap 68 to a width more narrow than the lithography resolution limit.

The processes described herein are compatible with a range of different conducting materials for the wiring lines formed by a variety of different processes. While the present invention has been described in terms of lower level wiring line interconnections, this should be understood as generically referring to a connection formed between conductors or conducting regions on different levels. The method does not require that the conductors be wiring lines or that the conductors be formed on adjacent levels, although certain aspects of the present invention will find their most preferred application to such structures. Those of ordinary skill in the art will appreciate that various modifications and alterations to the embodiments described herein might be made without altering the basic function of the present invention. Accordingly, the scope of the present invention is not limited to the particular embodiments described herein;

rather, the scope of the present invention is to be determined from the following claims.

What is claimed:

1. A method of forming an integrated circuit, comprising:

providing a dielectric layer over a substrate;

providing a via in the dielectric layer;

providing a first conductive layer on the dielectric and filling the via;

forming an opening through the first conductive layer so as to remove a portion of the first conductive layer from within the via, thereby to form a partially unfilled via;

forming a second conductive layer having a thickness, over the first conductive layer, over the exposed portion of the dielectric layer, and filling the partially unfilled via;

and etching back the second conductive so that part of the previously exposed portion of the dielectric layer is exposed a second time, and portions of the second conductive layer having approximately the same thickness as the thickness of the second conductive layer, remain within the opening thereby continuing to fill the partially unfilled via formed during the forming an opening.

2. The method of claim 1, wherein the second conductive layer formed over the first conductive layer has a smaller thickness than the first conductive layer.

3. The method of claim 2, wherein the portions of the second conductive layer remaining in the opening have a top region adjacent a top surface of the first conductive layer and a bottom region adjacent to the underlying layer, wherein the bottom region is wider than the top region.

4. The method of claim 3, wherein the portions of the second conductive region remaining in the opening have a tapered shape extending outward into the opening.

5. The method of claim 4, wherein the tapered shape is formed by plasma etching the second conductive region.

6. The method of claim 1, wherein etching through a portion of the second conductive layer includes removing the second conductive layer from over the first conductive layer.

7. The method of claim 1, wherein at least one of the first and second conductive layers is a conformal metal layer comprising a material selected from the group consisting of aluminum and tungsten.

8. The method of claim 1, wherein the via extends through the dielectric layer and contacts a region on the substrate.

9. A method of forming an integrated circuit according to claim 1, wherein the open separates parts of the first conductive layer defining separate wiring lines, and wherein the thickness of the second conductive layer is less the one half of a distance of separation of the wiring lines.

10. A method of forming an integrated circuit according to claim 9, wherein the distance of separation of the wiring lines is about 0.05 $\mu$m and the thickness of the second conductive layer is between about 200 Å and about 1000 Å.

* * * * *